(12) United States Patent
Kim et al.

(10) Patent No.: US 11,545,079 B2
(45) Date of Patent: Jan. 3, 2023

(54) DISPLAY DEVICE AND MANUFACTURING METHOD OF THE SAME

(71) Applicant: Samsung Display Co., LTD., Yongin-si (KR)

(72) Inventors: Jinyool Kim, Asan-si (KR); Kwangyoung Choi, Incheon (KR); Sae-Hee Ryu, Hwaseong-si (KR); Seungmin Song, Asan-si (KR); Seungmin Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/581,981

(22) Filed: Jan. 24, 2022

(65) Prior Publication Data

US 2022/0335883 A1 Oct. 20, 2022

(30) Foreign Application Priority Data

Apr. 14, 2021 (KR) .......................... 10-2021-0048569

(51) Int. Cl.
*G09G 3/32* (2016.01)

(52) U.S. Cl.
CPC ....... *G09G 3/32* (2013.01); *G09G 2300/0408* (2013.01); *G09G 2300/0426* (2013.01)

(58) Field of Classification Search
CPC ............. G09G 3/32; G09G 2300/0426; G09G 2300/0408
See application file for complete search history.

(56) References Cited

U.S. PATENT DOCUMENTS

| | | | |
|---|---|---|---|
| 8,044,398 B2 | 10/2011 | Ning et al. | |
| 9,450,196 B2 | 9/2016 | Kim et al. | |
| 10,090,486 B2 | 10/2018 | Li | |
| 10,163,940 B2 | 12/2018 | Kubota et al. | |
| 10,170,711 B2 | 1/2019 | Sauers et al. | |
| 2003/0168969 A1 | 9/2003 | Tanabe | |
| 2014/0312329 A1* | 10/2014 | Fujii | H01L 51/5228 438/34 |
| 2018/0233552 A1* | 8/2018 | Lee | H01L 22/32 |
| 2019/0189729 A1 | 6/2019 | Zhang et al. | |
| 2021/0013278 A1* | 1/2021 | Baek | H01L 27/3262 |

FOREIGN PATENT DOCUMENTS

| | | |
|---|---|---|
| JP | 2003-0255850 | 9/2003 |
| KR | 10-2009-0078527 | 7/2009 |
| KR | 10-2049735 | 11/2019 |

* cited by examiner

*Primary Examiner* — Muhammad N Edun
(74) *Attorney, Agent, or Firm* — H.C. Park & Associates, PLC

(57) ABSTRACT

A display device including a base substrate including a first base film, a second base film disposed on the first base film, and a connection wire, wherein at least a portion of the connection wire is disposed between the first base film and the second base film, a pixel circuit disposed on the base substrate, a light emitting element disposed on the pixel circuit and electrically connected to the pixel circuit, and a driving part disposed under the base substrate. The first base film has a first penetration part and a first protrusion part protruding toward the second base film, and the second base film has a second penetration part overlapping the first protrusion part and a second protrusion part protruding toward the first base film and overlapping the first penetration part. The connection wire extends to an upper surface of the base substrate along the first protrusion part.

20 Claims, 18 Drawing Sheets

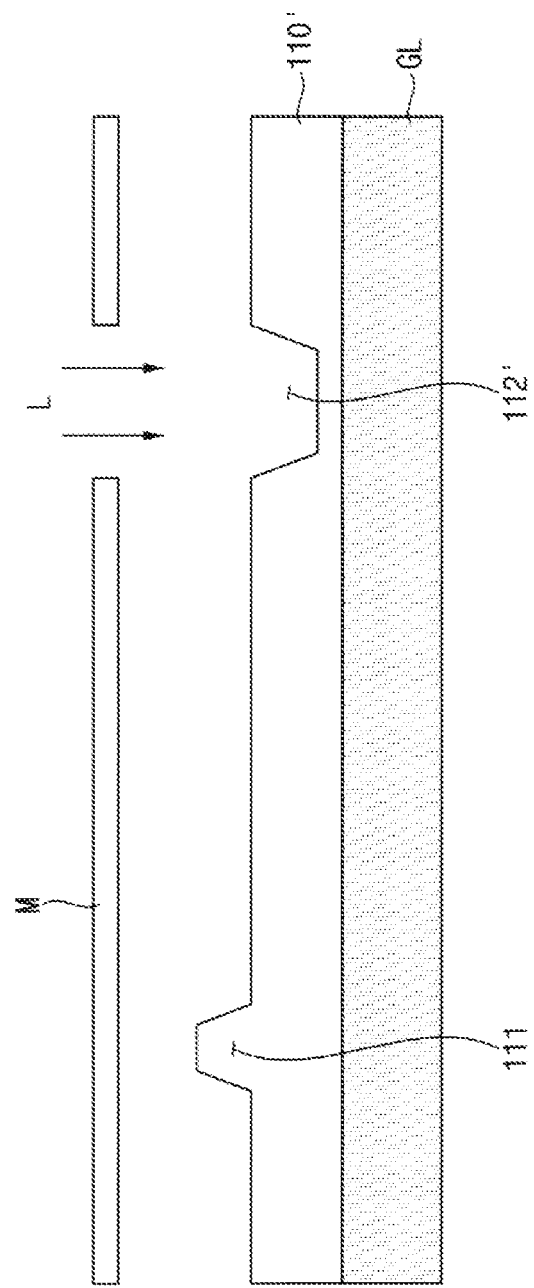

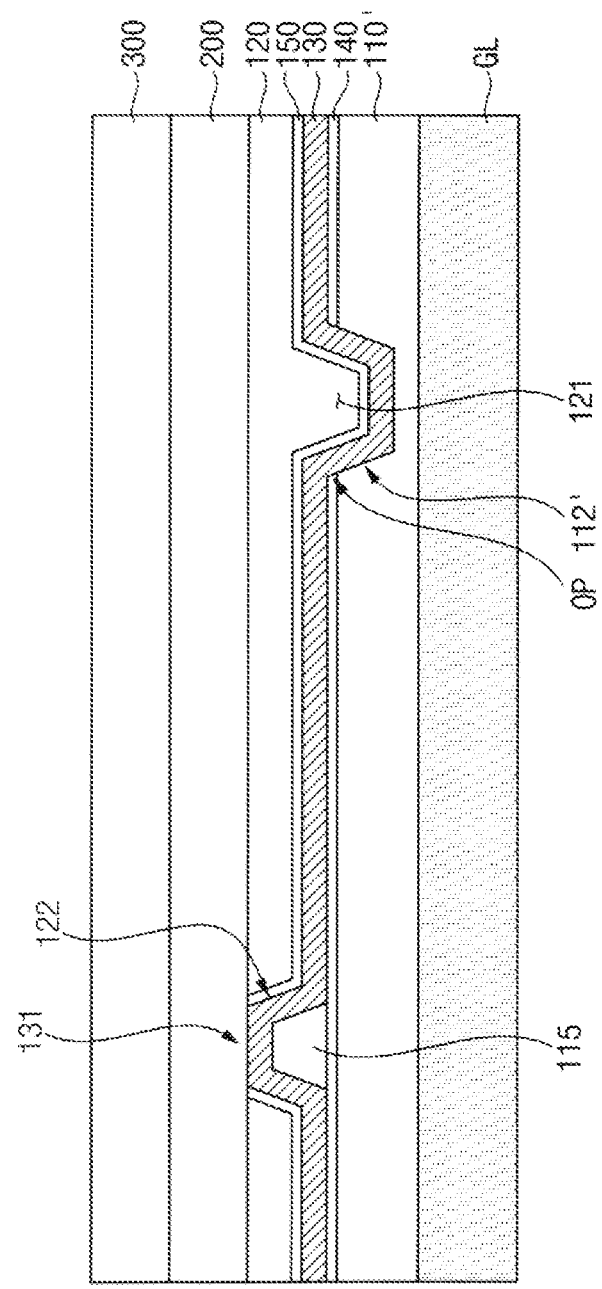

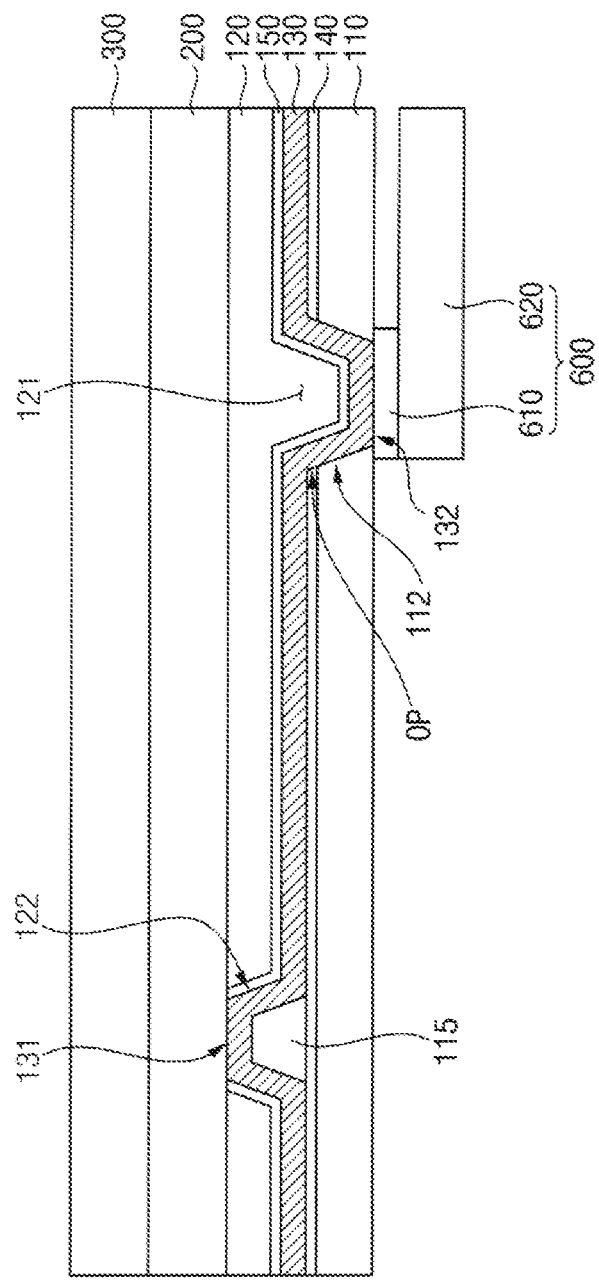

DISPLAY DEVICE AND MANUFACTURING METHOD OF THE SAME

CROSS-REFERENCE TO RELATED APPLICATION

This application claims priority from and the benefit of Korean Patent Application No. 10-2021-0048569, filed on Apr. 14, 2021, which is hereby incorporated by reference for all purposes as if fully set forth herein.

BACKGROUND

Field

Embodiments of the invention relate generally to a display device and manufacturing method of the display device. More specifically, embodiments relate to a tiled display device and manufacturing method of the tiled display device.

Discussion of the Background

In general, a tiled display device may include a plurality of display devices to implement a large screen. In this case, a bezel of a boundary between the plurality of display devices may be visually recognized by a user, and thus, deterioration in the display quality of the tiled display device may result.

The above information disclosed in this Background section is only for understanding of the background of the inventive concepts, and, therefore, it may contain information that does not constitute prior art.

SUMMARY

Embodiments of the present invention provide a display device with improved display quality.

Embodiments of the present invention also provide a method of manufacturing a display device with improved display quality.

Additional features of the inventive concepts will be set forth in the description which follows, and in part will be apparent from the description, or may be learned by practice of the inventive concepts.

An embodiment of the present invention provides a display device including a base substrate including a first base film, a second base film disposed on the first base film, and a connection wire, wherein at least a portion of the connection wire is disposed between the first base film and the second base film, a pixel circuit disposed on the base substrate, the pixel circuit including at least one transistor, a light emitting element disposed on the pixel circuit, the light emitting element electrically connected to the pixel circuit, and a driving part disposed under the base substrate. The first base film has a first penetration part and a first protrusion part protruding toward the second base film, and the second base film has a second penetration part overlapping the first protrusion part, and a second protrusion part protruding toward the first base film and overlapping the first penetration part. The connection wire extends to an upper surface of the base substrate along the first protrusion part, and extends to a lower surface of the base substrate along the second protrusion part, the connection wire being electrically connected to the pixel circuit and the driving part.

The connection wire may include a first surface defined as a portion of the connection wire exposed by the second penetration part on the upper surface of the base substrate, and a second surface defined as a portion of the connection wire exposed by the first penetration part on the lower surface of the base substrate.

The first surface may not overlap the second surface.

The driving part may include a driving circuit and a conductive bonding member electrically connected to the driving circuit. The second surface of the connection wire may directly contact the conductive bonding member.

The pixel circuit may include a pad electrode electrically connected to the transistor, and the first surface of the connection wire may directly contact the pad electrode.

Each of the first base film and the second base film may have flexibility.

Each of the first base film and the second base film may include polyimide.

Another embodiment of the present invention provides a display device including a base substrate including a first base film, a first insulation layer disposed on the first base film, a protrusion member disposed on the first insulation layer, a second base film disposed on the protrusion member, and a connection wire, wherein at least a portion of the connection wire is disposed between the first base film and the second base film, a pixel circuit disposed on the base substrate, the pixel circuit comprising at least one transistor, a light emitting element disposed on the pixel circuit, the light emitting element electrically connected to the pixel circuit, and a driving part disposed under the base substrate. The first base film has a first penetration part, and the second base film has a second penetration part overlapping the protrusion member, and a second protrusion part protruding toward the first base film and overlapping the first penetration part. The connection wire extends to an upper surface of the base substrate along the protrusion member, and extends to a lower surface of the base substrate along the protrusion part, the connection wire being electrically connected to the pixel circuit and the driving part.

The first insulation layer may have an opening overlapping the first penetration part.

The base substrate may further include a second insulation layer disposed between the connection wire and the second base film.

The connection wire may include a first surface defined as a portion of the connection wire exposed by the second penetration part on the upper surface of the base substrate, and a second surface defined as a portion of the connection wire exposed by the first penetration part on the lower surface of the base substrate.

The first surface may not overlap the second surface.

The driving part may include a driving circuit and a conductive bonding member electrically connected to the driving circuit. The second surface of the connection wire may directly contact the conductive bonding member.

The pixel circuit may include a pad electrode electrically connected to the transistor. The first surface of the connection wire directly contacts the pad electrode.

Each of the first base film, the protrusion member, and the second base film may have flexibility.

Each of the first base film, the protrusion member, and the second base film may include polyimide.

Another embodiment of the present invention provides a method of manufacturing a display device including forming a preliminary first base film on a carrier substrate; etching the preliminary first base film to from a first protrusion part protruding in a direction away from the carrier substrate and a first groove piercing in a direction closer to the carrier substrate; forming a connection wire on the preliminary first base film; forming a second base film on the connection wire; forming a pixel circuit on the second base film, the pixel circuit being electrically connected to the connection wire; forming a light emitting element on the pixel circuit; removing the carrier substrate; forming a first base film by etching a lower surface of the preliminary first base film to expose the connection wire overlapping the first groove; and forming a driving part under the first base film, the driving part being bonded to a lower surface of the first base film.

Forming a second base film may include forming a preliminary second base film on the connection wire; and etching an upper surface of the preliminary second base film to expose the connection wire overlapping the first protrusion part.

The preliminary first base film may include a lower film, an upper film disposed on the lower film, and a first insulation layer disposed between the lower film and the upper film. The first protrusion part may be formed by etching the upper film. The first groove may be formed by etching the first insulation layer and the lower film.

After forming a connection wire, a second insulation layer may be formed on the connection wire.

In the display device according to embodiments of the present invention, the driving part may be disposed under the base substrate. Also, the driving part may be connected to the pixel circuit through the connection line. Accordingly, the display having substantially no bezel or having a relatively small bezel may be provided.

In the display device according to embodiments of the present invention, there may be substantially no level difference or a relatively small level difference between the upper surface of the base substrate and an upper surface of the connection wire exposed on the upper surface of the base substrate. Also, there may be substantially no level difference or a relatively small level difference between the lower surface of the base substrate and a lower surface of the connection wire exposed on the lower surface of the base substrate. Accordingly, a stability of the pixel circuit and a stability of the driving part may be relatively increased.

In the method of manufacturing the display device according to embodiments of the present invention, there may be substantially no level difference or a relatively small level difference between an upper surface of the second base film and an upper surface of the connection wire exposed on the upper surface of the second base film. Accordingly, a stability of forming the pixel circuit may be relatively increased.

In the method of manufacturing the display device according to embodiments of the present invention, there may be substantially no level difference or a relatively small level difference between a lower surface of the first base film and a lower surface of the connection wire exposed on the lower surface of the first base film. Accordingly, a stability of forming the driving part may be relatively increased.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 8A, 8B, 8C, 8D, 8E, and 8F are cross-sectional views illustrating a method of manufacturing a display device according to an embodiment.

FIGS. 9A, 9B, 9C, 9D, 9E, and 9F are cross-sectional views illustrating a method of manufacturing a display device according to another embodiment.

DETAILED DESCRIPTION

Figure 1:
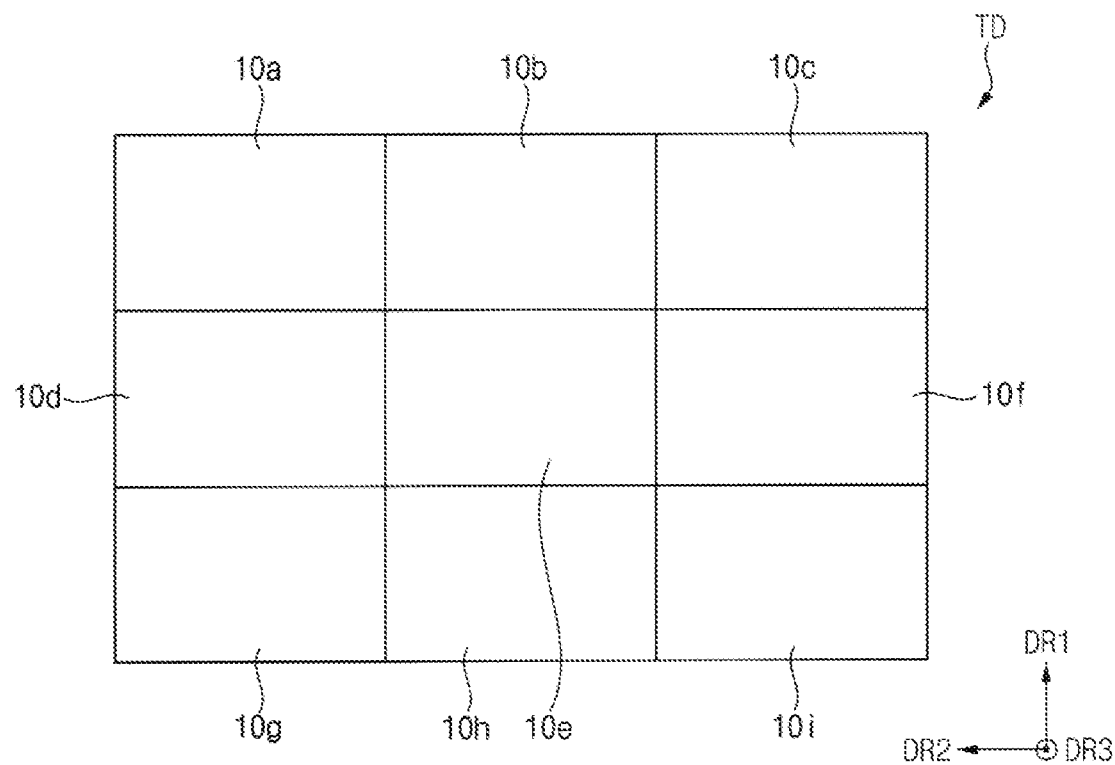
FIG. 1 is a plan view illustrating a tiled display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present invention will be described in more detail with reference to the accompanying drawings. The same reference numerals are used for the same components in the drawings, and redundant descriptions of the same components will be omitted.

FIG. 1 is a plan view illustrating a tiled display device according to an embodiment.

Referring to FIG. 1, a display device according to an embodiment may be a tiled display device TD including a plurality of display devices. In one embodiment, the display devices may display individual images. In another embodiment, the display devices may divide and display one image. The display devices may include display panels of the same type, structure, or size.

In an embodiment, the display devices may be arranged in a matrix from along a first direction DR1 and a second direction DR2 crossing the first direction DR1. For example, as shown in FIG. 1, the tiled display device TD may include first to ninth display devices 10a, 10b, 10c, 10d, 10e, 10f, 10g, 10h, and 10i arranged in a 3×3 shape in a plan view. The first to ninth display devices 10a, 10b, 10c, 10d, 10e, 10f, 10g, 10h, and 10i may display first to ninth images, respectively. A user may view an image in which the first to ninth images are combined. However, the inventive concepts are not limited thereto, and the tiled display device TD may include 2 to 8 or 10 or more display devices.

Figure 2:
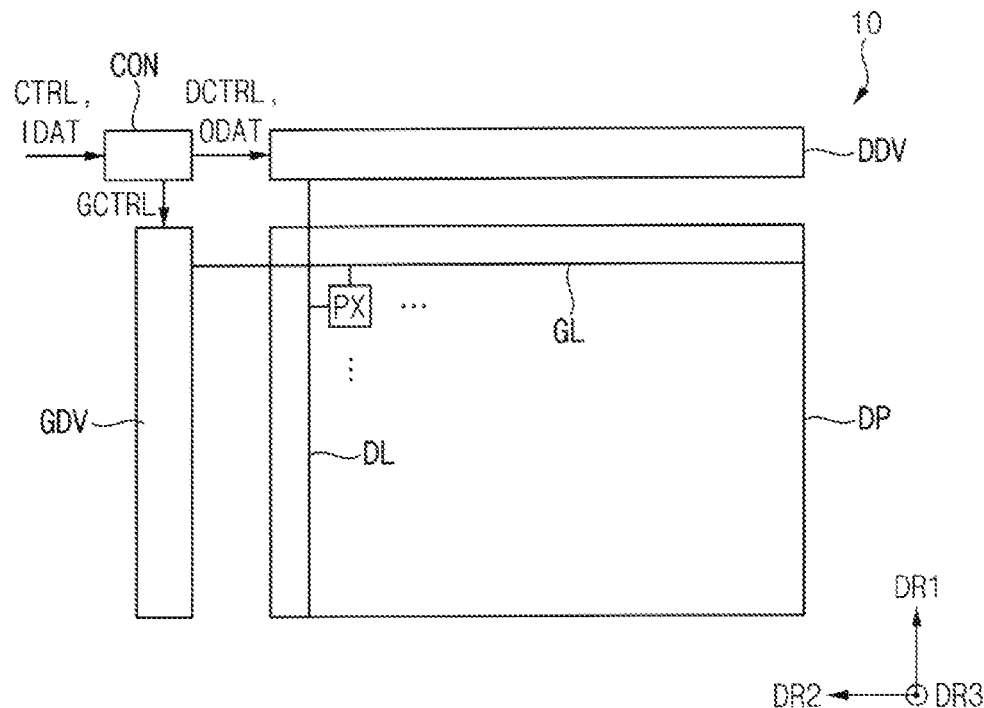
FIG. 2 is a block diagram illustrating a display device according to an embodiment.

FIG. 2 is a block diagram illustrating a display device according to an embodiment. For example, the display device 10 of FIG. 2 may represent any one of the first to ninth display devices 10a, 10b, 10c, 10d, 10e, 10f, 10g, 10h, and 10i of FIG. 1.

Referring to FIG. 2, the display device 10 may include a display panel DP and a driving part. The driving part may include a driving control part CON, a gate driving part GDV, and a data driving part DDV.

The display panel DP may include pixels PX, gate lines GL, and data lines DL. The pixels PX may be disposed in a display area where an image is displayed. The pixels PX may be electrically connected to the gate lines GL and the data lines DL. The pixels PX may be arranged in a matrix form along the first direction DR1 and the second direction DR2. Each of the pixels PX may include a transistor and a light emitting element. The light emitting element may emit light. For example, the light emitting element may be an inorganic light emitting diode or an organic light emitting diode.

The gate lines GL and the data lines DL may cross each other. For example, each of the gate lines GL may generally extend in the second direction DR2 and may be arranged in the first direction DR1. Each of the data lines DL may generally extend in the first direction DR1 and may be arranged in the second direction DR2.

The driving control part CON may generate a gate control signal GCTRL, a data control signal DCTRL, and an output image data ODAT based on an input image data IDAT and an input control signal CTRL provided from an external device. In an embodiment, the input image data IDAT may be RGB data including red image data, green image data, and blue image data. The input control signal CTRL may include a master clock signal and an input data enable signal. The input control signal CTRL may further include a vertical synchronization signal and a horizontal synchronization signal.

The gate driving part GDV may generate gate signals based on the gate control signal GCTRL provided from the driving control part CON. The gate control signal GCTRL may include a vertical start signal and a gate clock signal. The gate driving part GDV may sequentially output the gate signals to the gate lines GL of the display panel DP.

The data driving part DDV may generate data signals based on the data control signal DCTRL and the output image data ODAT provided from the driving controller CON. The data control signal DCTRL may include an output data enable signal, a horizontal start signal, and a load signal. The data driving part DDV may output data signals to the data lines DL of the display panel DP.

The gate driving part GDV and the data driving part DDV may be implemented as an integrated circuit. The gate driver GDV and the data driver DDV may include an IC chip, a substrate on which the IC chip is mounted, a film on where the IC chip is mounted, etc.

Figure 3:
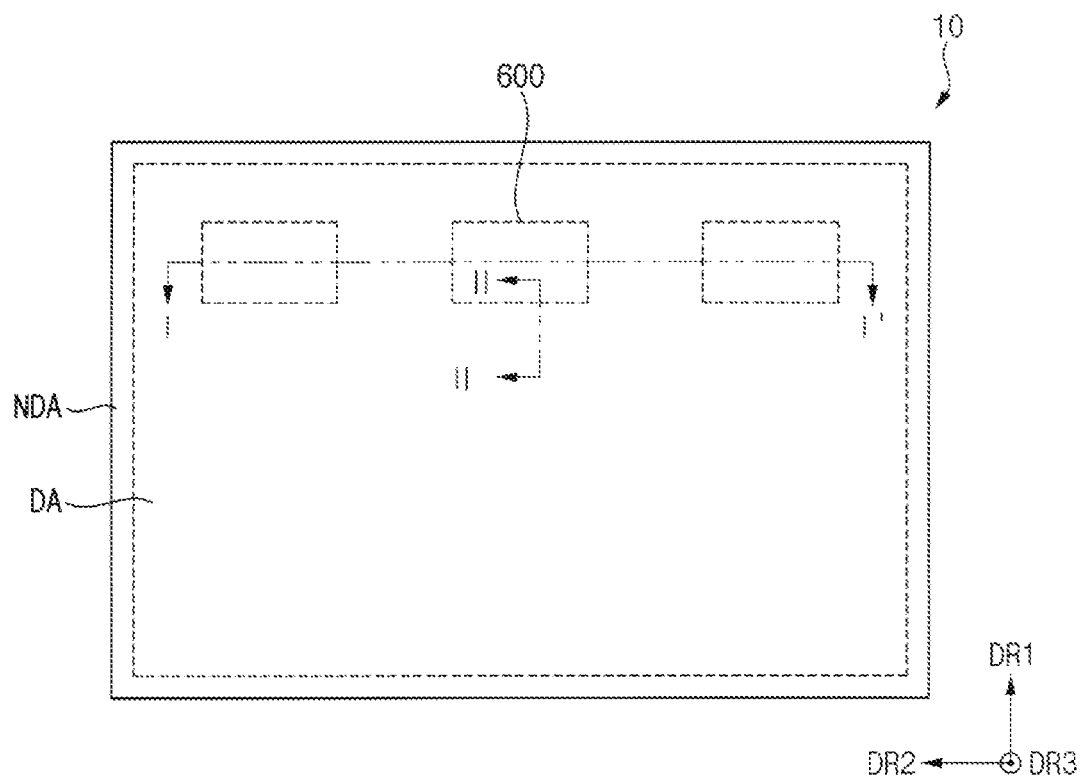
FIG. 3 is a plan view illustrating a display device according to an embodiment.
Figure 4:
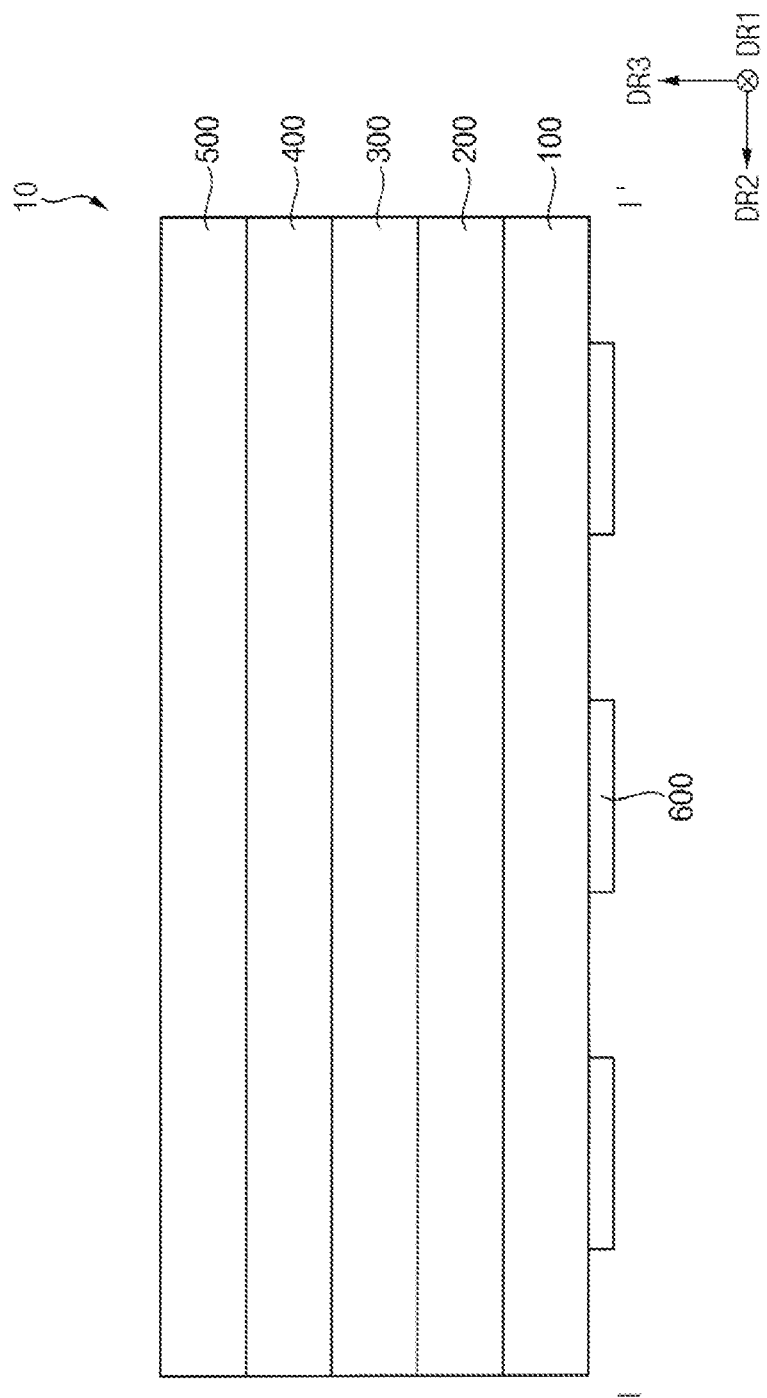
FIG. 4 is a cross-sectional view taken along a line I-I' of FIG. 3.
Figure 5:
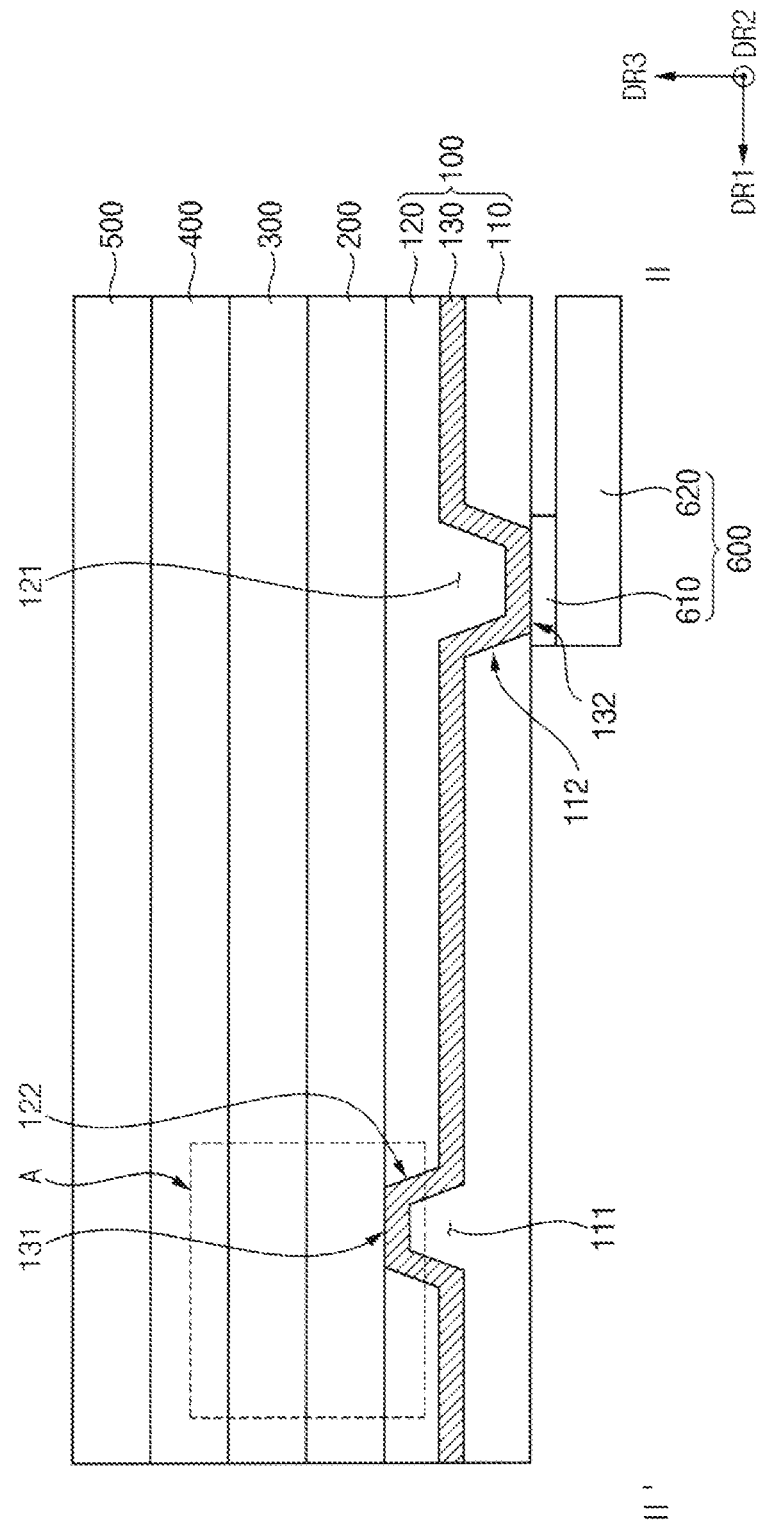
FIG. 5 is a cross-sectional view illustrating an embodiment taken along a line II-II' of FIG. 3.

FIG. 3 is a plan view illustrating a display device according to an embodiment. FIG. 4 is a cross-sectional view taken along a line I-I' of FIG. 3. FIG. 5 is a cross-sectional view illustrating an embodiment taken along a line II-II' of FIG. 3.

Referring to FIG. 3, a display device 10 may be any one of the first to ninth display devices 10a, 10b, 10c, 10d, 10e, 10f, 10g, 10h, and 10i of FIG. 1. The display device 10 may include a display area DA and a peripheral area NDA. The display area DA may be an area for displaying an image. Pixels may be disposed in the display area DA.

The peripheral area NDA may surround the display area DA. Alternatively, the peripheral area NDA may be disposed on one side of the display device 10 to be adjacent to the display area DA. A driving part may be disposed in the peripheral area NDA. The driving part may be electrically connected to the pixels. In another embodiment, the peripheral area NDA may be omitted. In this case, the driver may be disposed in the display area DA.

Referring to FIG. 3, FIG. 4, and FIG. 5, the display device 10 may include a base substrate 100, a pixel circuit 200, a light emitting element 300, a polarization layer 400, a window 500, and a driving part 600.

The base substrate 100 may include a first base film 110, a second base film 120, and a connection wire 130.

The first base film 110 may be a transparent insulating film. The first base film 110 may have flexibility to enable bending. For example, the first base film 110 may include polyimide (PI), polyethersulfone (PES), polyacrylate (PAR), polyetherimide (PEI), polyethylene naphthalate (PEN), polyethylene terephthalate (PET), polyphenylene sulfide (PPS), polycarbonate (PC), cellulose acetate propionate (CAP), etc.

The second base film 120 may be disposed on the first baes film 110. The second base film 120 may be a transparent insulating film. The second base film 120 may have flexibility to enable bending. The second base film 120 may include substantially same material as the first base film 110.

The first base film 110 may have a first protrusion part 111 protruding toward the second base film 120. In other words, the first base film 110 may have the first protrusion part 111 protruding in a third direction DR3 perpendicular to the first direction DR1 and the second direction DR2. The second base film 120 may have a second protrusion part 121 protruding toward the first base film 110. In other words, the second base film 120 may have the second protrusion part 121 protruding in a direction opposite to the third direction DR3.

The first base film 110 may have a first penetrating part 112 overlapping the second protrusion part 121 and penetrating the first base film 110. The second base film 120 may have a second penetrating part 122 overlapping the first protrusion part 111 and penetrating the second base film 120.

At least a portion of the connection wire 130 may be disposed between the first base film 110 and the second base film 120. Specifically, the connection wire 130 may be arranged to extend to an upper surface of the base substrate 110 along the first protrusion part 111 and extend to a lower surface of the base substrate 100 along the second protrusion part 121.

Accordingly, the connection wire 130 may include a first surface 131 defined as a portion exposed by the second penetrating part 122 on the upper surface of the base substrate 100, and a second surface 132 defined as a portion exposed by the first penetrating part 112 on the lower surface of the base substrate 100. As shown in FIG. 5, the first surface 131 and the second surface 132 may not overlap. For example, the first surface 131 may be spaced apart from the second surface 132 in the first direction DR1.

There may be substantially no level difference or a relatively small level difference between the first surface 131 and an upper surface of the second base film 120. In addition, there may be substantially no level difference or a relatively small level difference between the second surface 132 and a lower surface of the first base film 110.

The connection wire 130 may include a conductive material, such as metal. For example, the connection wire 130 may include copper (Cu).

The connection wire 130 may be electrically connected to each of the pixel circuit 200 and the driving part 600. For example, the first surface 131 of the connection wire 130 may contact the pixel circuit 200, and the second surface 132 of the connection wire 130 may contact the driver 600. Accordingly, the connection wire 130 may electrically connect the pixel circuit 200 and the driver 600.

The pixel circuit 200 may be disposed on the base substrate 100. The pixel circuit 200 may include at least one transistor. The light emitting element 300 may be disposed on the pixel circuit 200. The light emitting element 300 may be electrically connected to the pixel circuit 200. The polarization layer 400 may be disposed on the light emitting element 300. The polarization layer 400 may prevent external light from being reflected and recognized by user. The polarization layer 400 may be omitted. The window 500 may be disposed on the polarization layer 400. The window 500 may transmit light emitted from the light emitting element 300.

In the display device 10, there may be substantially no level difference or a relatively small level difference between the first surface 131 and the upper surface of the second base film 120. Accordingly, the pixel circuit 200 may be disposed on a substantially flat surface.

The driving part 600 may be disposed under the lower surface of the base substrate 100. The driving part 600 may include a conductive bonding member 610 and a driving circuit 620. The driving part 600 may be substantially the same as the data driving part DDV described with reference to FIG. 2.

The conductive bonding member 610 may include a conductive material. In an embodiment, the conductive bonding member 610 may be formed by soldering the conductive material at a relatively low temperature. In an embodiment, the conductive bonding member 610 may include a conductive ball and a cured resin. The conductive ball may include a conductive polymer. The conductive ball may be electrically connected to the second surface 132 of the connection wire 130. For example, the conductive ball may directly contact the second surface 132 of the connection wire 130. The cured resin may provide adhesive force so that the driving part 600 is bonded to the lower surface of the base substrate 100.

The driving circuit 620 may generate an electrical signal (for example, a data signal). The driving circuit 620 may be electrically connected to the conductive bonding member 610, and may transmit the electrical signal to the conductive bonding member 610. The electrical signal may be transmitted to the connection wire 130 through the conductive bonding member 610.

In the display device 10, there may be substantially no level difference, or a relatively small level difference between the second surface 132 and the lower surface of the first base film 110. Accordingly, the driving part 600 may be disposed under a substantially flat surface.

Figure 6:
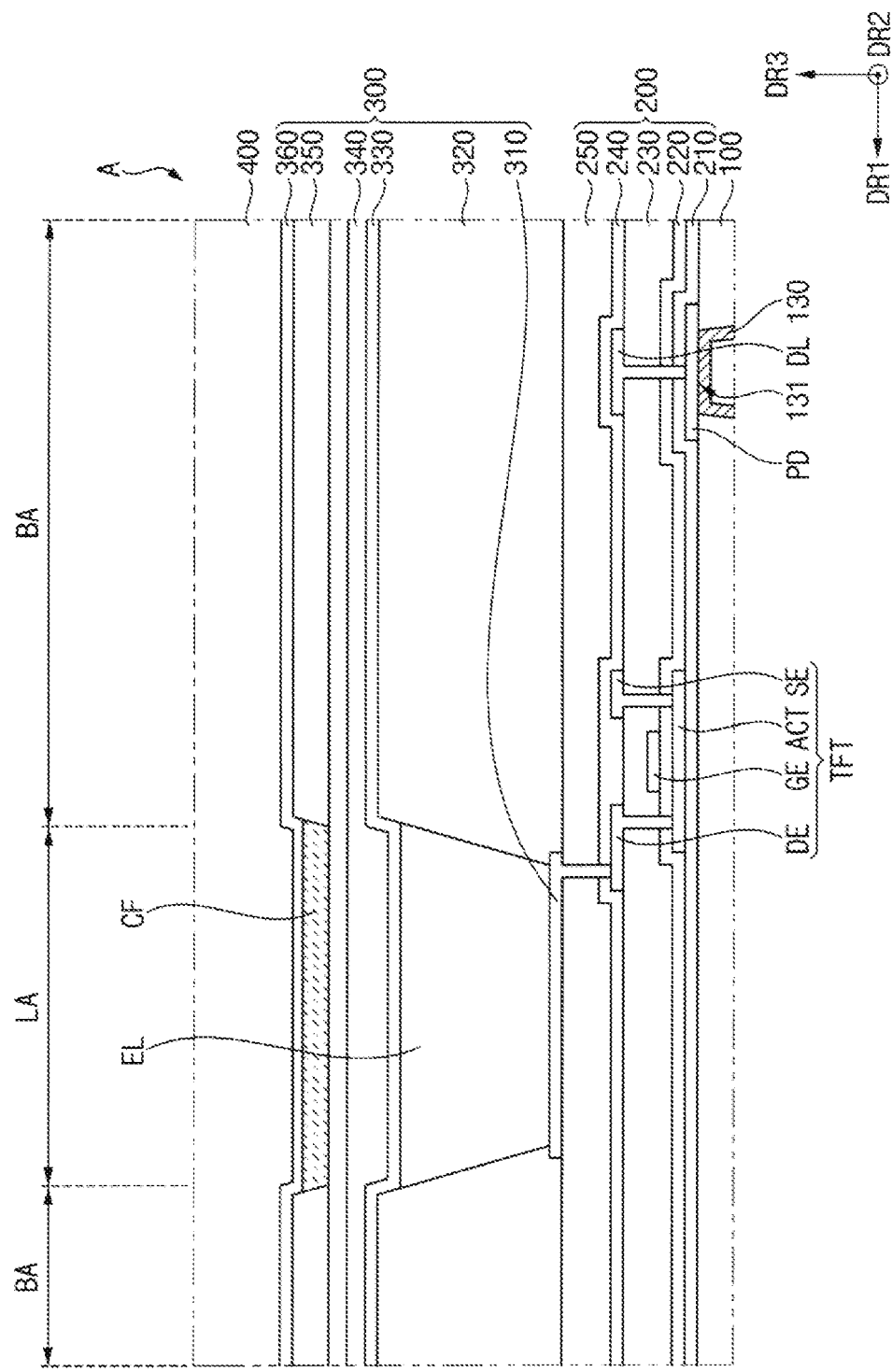
FIG. 6 is an enlarged cross-sectional view of an area A of FIG. 5.

FIG. 6 is an enlarged cross-sectional view of an area A of FIG. 5.

Referring to FIG. 3, FIG. 5, and FIG. 6, the pixel circuit 200 may include a transistor TFT, a buffer layer 210, a gate insulation layer 220, an interlayer insulation layer 230, a first protection layer 240, a first planarization layer 250, a pad electrode PD, and a data line DL. The transistor TFT may include an active layer ACT, a gate electrode GE, a source electrode SE, and a drain electrode DE.

The buffer layer 210 may be disposed on the base substrate 100. For example, the buffer layer 210 may be disposed on the second base film 120. The buffer layer 210 may cover the pad electrode PD. The buffer layer 210 may include an inorganic insulation material. The buffer layer 210 may prevent diffusion of impurities.

The active layer ACT may be disposed on the buffer layer 210. For example, the active layer ACT may include a silicon semiconductor, an oxide semiconductor, etc. The silicon semiconductor may include amorphous silicon, polycrystalline silicon, etc. The active layer ACT may include a source area, a drain area, and a channel area. The source area and the drain area may be doped with impurities. The channel area may be disposed between the source area and the drain area.

The gate insulation layer 220 may be disposed on the buffer layer 210. The gate insulation layer 220 may cover the active layer ACT. The gate insulation layer 220 may include an inorganic insulation material.

The gate electrode GE may be disposed on the gate insulation layer 220. The gate electrode GE may overlap the channel area of the active layer ACT. The gate electrode GE may include a metal, an alloy, a conductive metal oxide, a transparent conductive material, etc. For example, the gate electrode GE may include silver (Ag), alloy containing silver, molybdenum (Mo), alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO)), indium zinc oxide (IZO), etc.

The interlayer insulation layer 230 may be disposed on the gate insulation layer 220. The interlayer insulation layer 230 may cover the gate electrode GE. The interlayer insulation layer 230 may include an inorganic insulation material.

The source electrode SE and the drain electrode DE may be disposed on the interlayer insulation layer 230. The source electrode SE and the drain electrode DE may be connected to the source area and the drain area through contact hole, respectively. The source electrode SE and the drain electrode DE may include a metal, an alloy, a conductive metal oxide, a conductive metal nitride, a transparent conductive material, etc. The active layer ACT, the gate electrode GE, the source electrode SE, and the drain electrode DE may define the transistor TFT.

The first protection layer 240 may cover the transistor TFT. The first protection layer 240 may protect the transistor TFT.

The first planarization layer 250 may be disposed on the first protection layer 240. An upper surface of the first planarization layer 250 may be substantially flat. The first planarization layer 250 may include an organic insulation material. For example, the first planarization layer 250 may include a photoresist, a polyacryl-based resin, a polyimide-based resin, a polyamide-based resin, and a siloxane-based resin, an acryl-based resin, epoxy-based resin, etc.

The pad electrode PD may be disposed on the connection wire 130. For example, the pad electrode PD may be disposed to directly contact the first surface 131 of the connection wire 130. The pad electrode PD may be electrically connected to the transistor TFT.

The data line DL may be disposed on the interlayer insulation layer 230. The data line DL may include a metal, an alloy, a conductive metal oxide, a transparent conductive material, etc. The data line DL may be electrically coupled to the pad electrode PD through a contact hole formed in the buffer layer 210, the gate insulation layer 220, and the interlayer insulation layer 230. The data line DL may receive the electrical signal generated by the driving part 600 through the pad electrode PD. For example, the data line DL may be electrically coupled to the source electrode SE, and may transmit the data signal to the source electrode SE.

The light emitting element 300 may include a first electrode 310, an emitting layer EL, a pixel defining layer 320, a second electrode 330, a second protection layer 340, a light block layer 350, a color filter layer CF, and a third protection layer 360.

The first electrode 310 may be disposed on the first planarization layer 250. The first electrode 310 may include a conductive material. The first electrode 310 may be electrically connected to the drain electrode DE.

The pixel defining layer 320 may be disposed on the first electrode 310. The pixel defining layer 320 may include a pixel opening exposing a portion of the first electrode 310. The pixel defining layer 320 may define a light emitting area LA.

The emitting layer EL may be disposed on the first electrode 310. The emitting layer EL may be disposed in the pixel opening. The emitting layer EL may receive an electrical signal from the first electrode 310, and may emit light having a luminance corresponding to a level of the electrical signal.

The second electrode 330 may be disposed on the emitting layer EL. A portion of the second electrode 330 may be disposed on the pixel defining layer 320. The second electrode 330 may transmit an electrical signal to the emitting layer EL.

The second protection layer 340 may be disposed on the second electrode 330. The second protection layer 340 may cover the second electrode 330, the emitting layer EL, and the first electrode 310. The second protection layer 340 may protect the second electrode 330, the emitting layer EL, and the first electrode 310.

The light block layer 350 may be disposed on the second protection layer 340. The light block layer 350 may overlap the pixel defining layer 320. The light block layer 350 may have an opening overlapping the light emitting area LA.

In the light emitting area LA, the color filter layer CF may be disposed on the second protection layer 340. The color filter layer CF may be disposed in the opening of the light block layer 350. For example, the color filter layer CF may be surrounded by the light block layer 350 in a plan view. The color filter layer CF may selectively transmit light having a specific color and block or absorb light having a color different from the specific color.

The third protective layer 360 may cover the color filter layer CF and the light block layer 350. The third protective layer 360 may protect the color filter layer CF and the light block layer 350.

Figure 7:
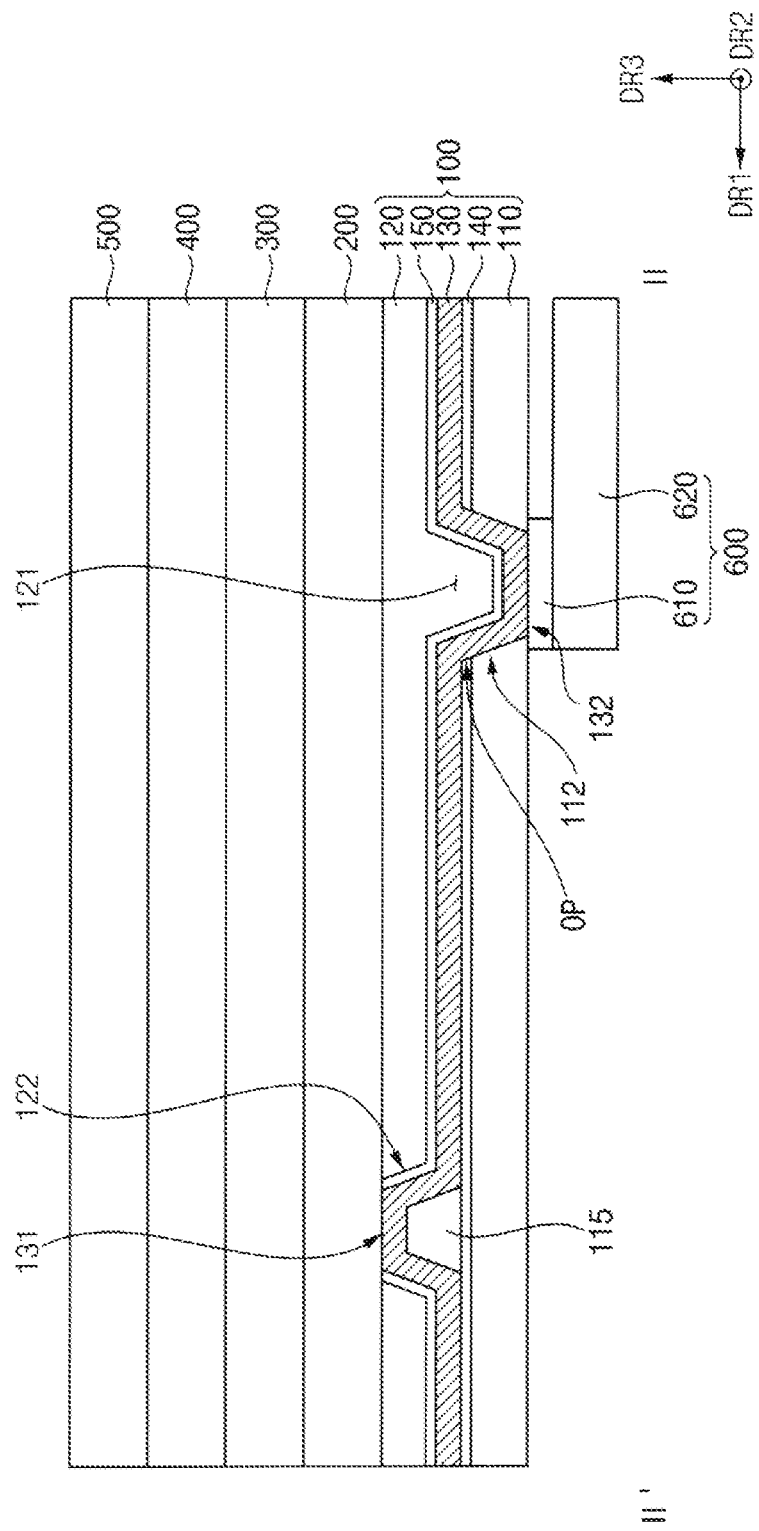
FIG. 7 is a cross-sectional view illustrating another embodiment taken along a line II-II' of FIG. 3.

FIG. 7 is a cross-sectional view illustrating another embodiment taken along a line II-II' of FIG. 3. The embodiment described with reference to FIG. 7 may be substantially the same as the embodiment described with reference to FIG. 3, FIG. 4, and FIG. 5 except for the base substrate 100.

Referring to FIG. 3 and FIG. 7, the display device 10 according to another embodiment of the present invention may include a base substrate 100, a pixel circuit 200, a light emitting element 300, a polarization layer 400, a window 500, and a driving part 600.

The pixel circuit 200, the light emitting element 300, the polarization layer 400, the window 500, and the driving part 600 may be substantially the same as the pixel circuit 200, the light emitting element 300, the polarization layer 400, the window 500, and the driving part 600 described with reference to FIG. 3, FIG. 4, FIG. 5, and FIG. 6.

The base substrate 100 may include a first base film 110, a first insulation layer 140, a protrusion member 115, a second base film 120, and a connection wire 130.

The first base film 110 may be a transparent insulation film. The first base film 110 may have flexibility to enable bending. For example, the first base film 110 may include polyimide (PI), polyethersulfone (PES), polyacrylate (PAR), polyetherimide (PEI), polyethylene naphthalate (PEN), polyethylene terephthalate (PET), polyphenylene sulfide (PPS), polycarbonate (PC), cellulose acetate propionate (CAP), etc.

The first insulation layer 140 may be disposed on the first base film 110. The first insulation layer 140 may include an inorganic insulation material. For example, the first insulation layer 140 may include silicon oxide, silicon nitride, etc.

The protrusion member 115 may be a transparent insulation film. The protrusion member 115 may protrude toward the second base film 120. In other words, the protrusion member 115 may protrude in third direction DR3.

The second base film 120 may be disposed on the protrusion member 115. The second base film 120 may be a transparent insulation film. The second base film 120 may have flexibility to enable bending. The second base film 120 may include substantially the same material as the first base film 110.

The second base film 120 may have a protrusion part 121 protruding toward the first base film 110. In other words, the second base film 120 may have a protrusion part 121 protruding in a direction opposite to the third direction DR3.

The first base film 110 may have a first penetration part 112 penetrating the first base film and overlapping the protrusion part 121. The second base film 120 may have a second penetration part 122 penetrating the second base film 120 and overlapping the protrusion part 121.

At least a portion of the connection wire 130 may be disposed between the first base film 110 and the second base film 120. Specifically, the connection wire 130 may be disposed to extend to an upper surface of the base substrate 100 along the protrusion member 115 and extend to a lower surface of the base substrate 100 along the protrusion part 121. Accordingly, the connection wire 130 may include a first surface 131 defined as a portion exposed by the second penetration part 122 on the upper surface of the base substrate 100, and a second surface 132 defined as a portion exposed by the first penetration part 122 on the lower surface of the base substrate 100. As shown in FIG. 7, the first surface 131 and the second surface 132 may not overlap. For example, the first surface 131 may be spaced apart from the second surface 132 in the first direction DR1.

The connection wire 130 may include a conductive material such as a metal. For example, the connection wire 130 may include copper (Cu).

The connection wire 130 may be electrically connected to the pixel circuit 200 and the driving part 600, respectively. For example, the first surface 131 of the connection wire 130 may contact the pixel circuit 200, and the second surface 132 of the connection wire 130 may contact the driving part 600. Accordingly, the connection wire 130 may electrically connect the pixel circuit 200 and the driving part 600.

In an embodiment, the first insulation layer 140 may have an opening OP overlapping the first penetration part 112. Accordingly, the first penetration part 112 may directly contact the connection wire 130.

In an embodiment, the base substrate 100 may include a second insulation layer 150 disposed between the connection wire 130 and the second base film 120. The second insulation layer 150 may include an inorganic insulation material. For example, the second insulation layer 150 may include silicon oxide, silicon nitride, etc.

In the display device 10, there may be substantially no level difference or a relatively small level difference between the first surface 131 and an upper surface of the second base film 120. Accordingly, the pixel circuit may be disposed on a substantially flat surface. In addition, in the display device 10, there may be substantially no level difference or a relatively small level difference between the second surface 132 and a lower surface of the first base film 110. Accordingly, the driving part 600 may be disposed under a substantially flat surface.

FIGS. 8A to 8F are cross-sectional views illustrating a method of manufacturing a display device according to an embodiment.

Figure 8A:
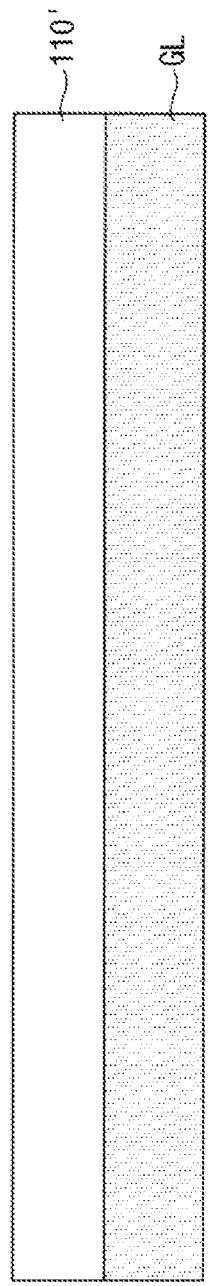

Referring to FIG. 8A, a preliminary first base film 110' may be formed on a carrier substrate GL. The carrier substrate GL may include glass. The preliminary first base film 110' may be a transparent insulation film.

Figure 8B:
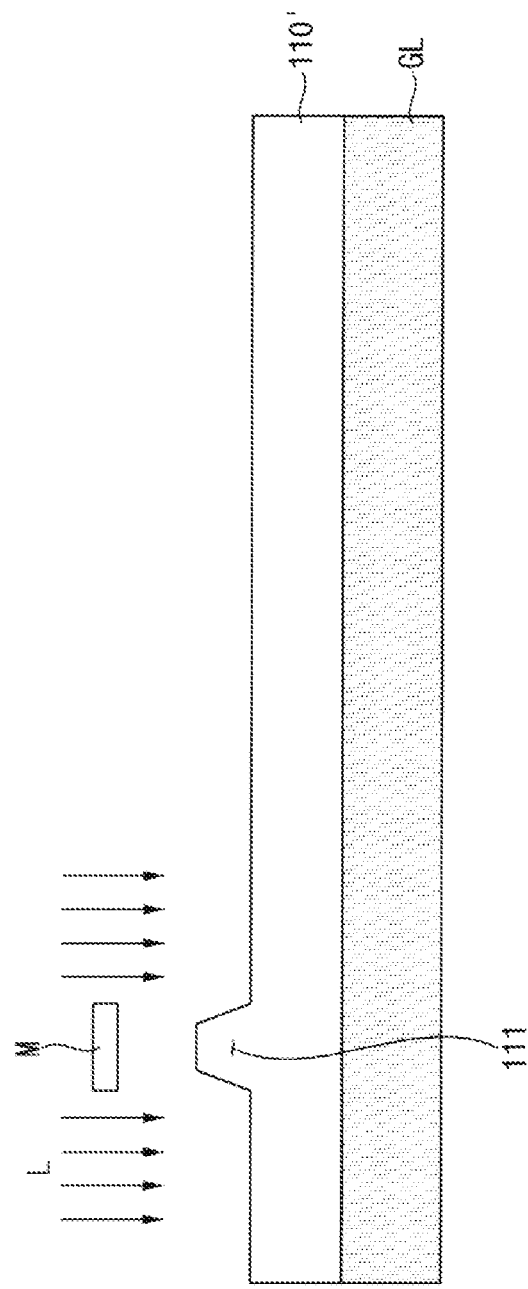

Referring to FIG. 8B and FIG. 8C, the preliminary first base film 110' may be etched to from the first protrusion part 111 and the first groove 112'

The preliminary first base film 110' may be etched by laser L after disposing a mask M on the preliminary first base film 110'. However, a method of etching the preliminary first base film 110' is not limited thereto. For example, the preliminary first base film 110' may be etched by plasma.

The first protrusion part 111 may protrude in a direction away from the carrier substrate GL. The first grove 112' may be formed in a direction toward the carrier substrate GL.

Figure 8D:
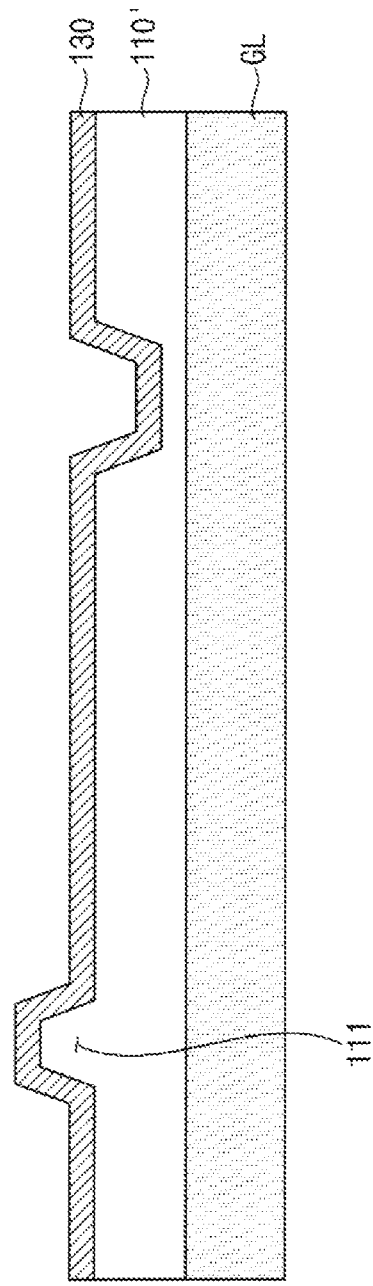

Referring to FIG. 8D, a connection wire 130 may be formed on the preliminary first base film 110'. The connection wire 130 may include a conductive material such as metal. For example, the connection wire 130 may include copper (Cu).

Figure 8E:
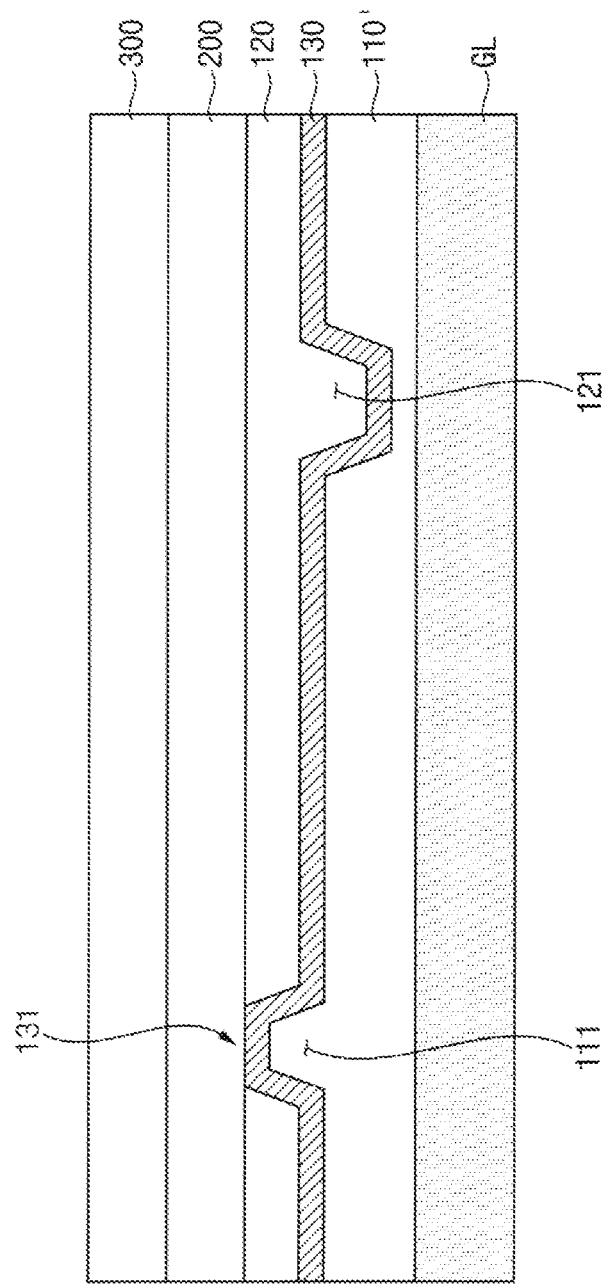

Referring to FIG. 8E, a second base film 120 may be formed on the connection wire 130. The second base film 120 may include substantially same material as the first base film 110'.

In an embodiment, forming of the second base film 120 may include forming a preliminary second base film on the connection wire 130 and etching an upper surface of the preliminary second base film to expose a first surface 131 of the connection wire 130 overlapping the first protrusion part 111.

A pixel circuit 200 electrically connected to the connection wire 130 may be formed on the second base film 120. The pixel circuit 200 may include at least one transistor. The transistor may be electrically connected to the connection wire 130 through the first surface 130 of the connection wire 130.

After forming the pixel circuit 200, a light emitting element 300 may be formed on the pixel circuit 200. The light emitting element 300 may be electrically connected to the transistor.

After forming the light emitting element 300, the carrier substrate GL may be removed. Thereafter, a first base film 110 may be formed by etching a lower surface of the preliminary first base film 110' to expose the connection wire 130 overlapping the first groove 112'. Accordingly, a second surface 132 of the connection wire 130 may be exposed.

There may be substantially no level difference or relatively small level difference between the first surface 131 and an upper surface of the second base film 120. Accordingly, the pixel circuit 200 may be formed on a substantially flat surface.

Figure 8F:
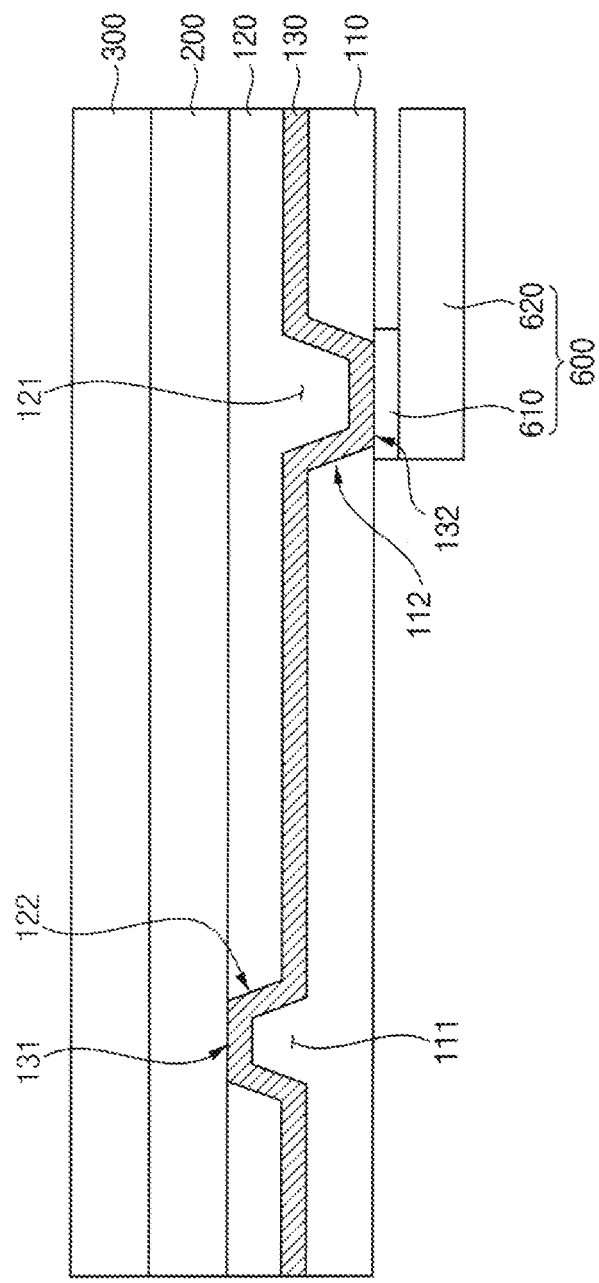

Referring to FIG. 8F, after forming the first base film 110, the driving part 600 may be disposed under the first base film 110. In this case, the second surface 132 of the connection wire 130 may be directly contact a conductive bonding material 610 of the driving part 600.

There may be substantially no level difference or a relatively small level difference between the second surface 132 and a lower surface of the first base film 110. Accordingly, the driving part 600 may be formed under a substantially flat surface.

FIGS. 9A to 9F are cross-sectional views illustrating a method of manufacturing a display device according to another embodiment. Any description that overlaps with FIGS. 8A to 8F will be omitted.

Figure 9A:
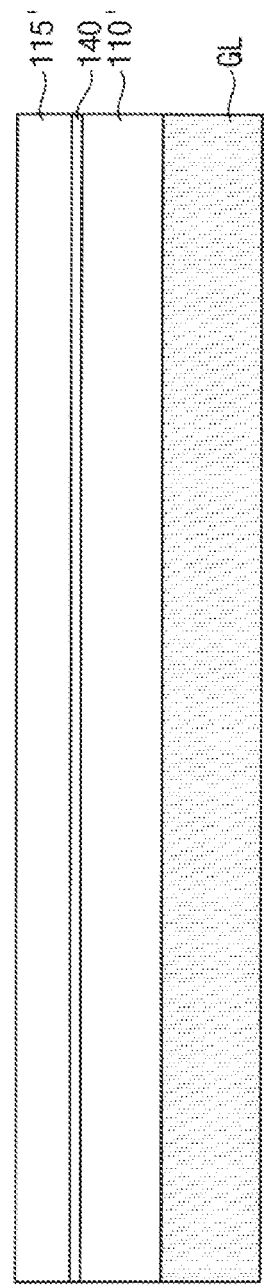

Referring to FIG. 9A, a lower film 110' may be formed on a carrier substrate GL, a first insulation layer 140 may be formed on the lower film 110', and an upper film 115' may be formed on the first insulation layer 140.

Figure 9B:
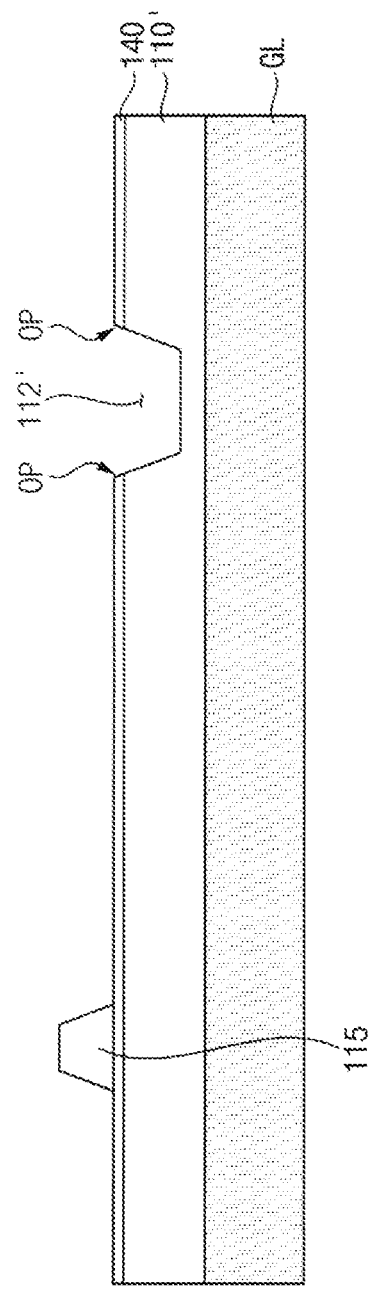

Referring to FIG. 9B, the first insulation layer 140 and the upper film 115' may be etched to form a protrusion member 115, a first groove 112', and an opening OP.

The protrusion member 115 may protrude in a direction away from the carrier substrate GL. The first groove 112' may be formed in a direction closer to the carrier substrate GL. The opening OP may overlap the first groove 112'.

Figure 9C:
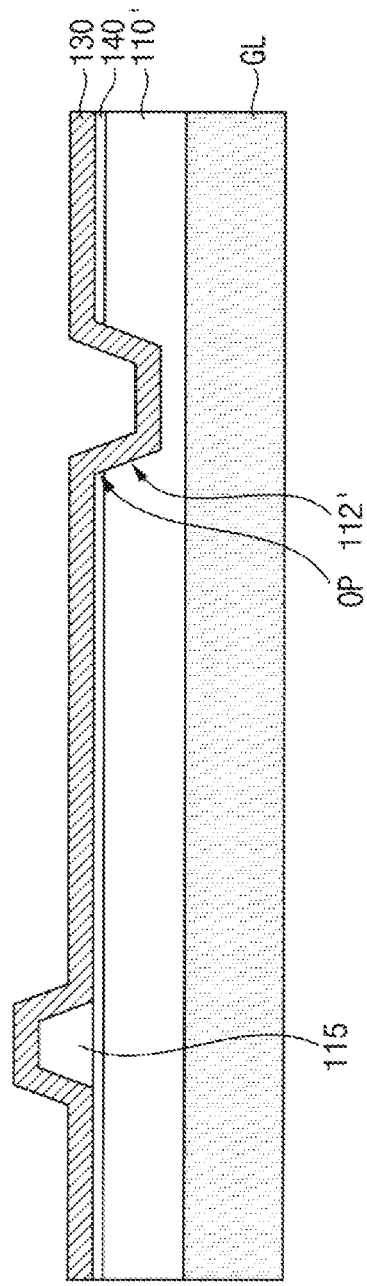

Referring to FIG. 9C, a connection wire 130 may be formed on the protrusion member 115.

Figure 9D:
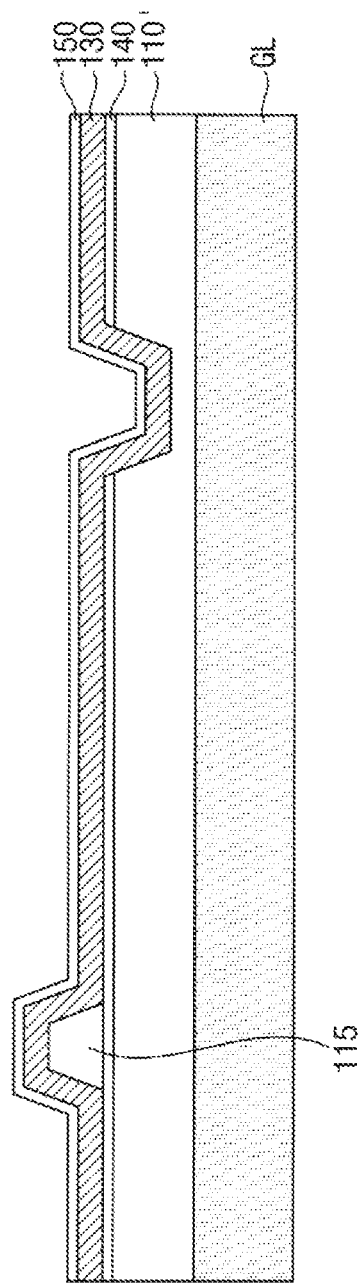

Referring to FIG. 9D, a second insulation layer 150 may be formed on the connection wire 130.

Referring to FIG. 9E, after forming a second base film 120 on the second insulation layer 150, a pixel circuit 200 electrically connected to the connection wire 130 may be formed on the second base film 120. The pixel circuit 200 may include at least one transistor. The transistor may be electrically connected to the connection wire 130 through a first surface 131 of the connection wire 130.

After forming the pixel circuit 200, a light emitting element 300 may be formed on the pixel circuit 200. The light emitting element 300 may be electrically connected to the transistor.

There may be substantially no level difference or a relatively small level difference between the first surface 131 and an upper surface of the second base film 120. Accordingly, the pixel circuit may be formed on a substantially flat surface.

Referring to FIG. 9F, the carrier substrate GL may be removed, Thereafter, a first base film 110 may be formed by etching a lower surface of the lower film 110' to expose the connection wire 130 overlapping the first groove 112'. Accordingly, a second surface 132 of the connection wire 130 may be exposed.

After forming the first base substrate 110, a driving part 600 may be disposed under a lower surface of the first base film 110. For example, the second surface 132 of the connection wire 130 may contact a conductive bonding member 610 of the driving part 600.

There may be substantially no level difference between the second surface 132 and the lower surface of the first base film 110. Accordingly, the driving part 600 may be formed under a substantially flat surface.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a base substrate comprising a first base film, a second base film disposed on the first base film, and a connection wire, wherein at least a portion of the connection wire is disposed between the first base film and the second base film;
   a pixel circuit disposed on the base substrate, the pixel circuit comprising at least one transistor;
   a light emitting element disposed on the pixel circuit, the light emitting element electrically connected to the pixel circuit; and
   a driving part disposed under the base substrate,
   wherein:
   the first base film has a first penetration part and a first protrusion part protruding toward the second base film;
   the second base film has a second penetration part overlapping the first protrusion part and a second protrusion part protruding toward the first base film and overlapping the first penetration part; and the connection wire extends to an upper surface of the base substrate along the first protrusion part, and extends to a lower surface of the base substrate along the second protrusion part, the connection wire being electrically connected to the pixel circuit and the driving part.

2. The display device of claim 1, wherein the connection wire comprises:
a first surface defined as a portion of the connection wire exposed by the second penetration part on the upper surface of the base substrate; and
a second surface defined as a portion of the connection wire exposed by the first penetration part on the lower surface of the base substrate.

3. The display device of claim 2, wherein the first surface dose not overlap the second surface.

4. The display device of claim 2, wherein:
the driving part comprises a driving circuit and a conductive bonding member electrically connected to the driving circuit; and
the second surface of the connection wire directly contacts the conductive bonding member.

5. The display device of claim 2, wherein:
the pixel circuit comprises a pad electrode electrically connected to the transistor; and
the first surface of the connection wire directly contacts the pad electrode.

6. The display device of claim 1, wherein each of the first base film and the second base film has flexibility.

7. The display device of claim 1, wherein each of the first base film and the second base film comprises polyimide.

8. A display device comprising:
a base substrate comprising a first base film, a first insulation layer disposed on the first base film, a protrusion member disposed on the first insulation layer, a second base film disposed on the protrusion member, and a connection wire, wherein at least a portion of the connection wire is disposed between the first base film and the second base film;
a pixel circuit disposed on the base substrate, the pixel circuit comprising at least one transistor;
a light emitting element disposed on the pixel circuit, the light emitting element electrically connected to the pixel circuit; and
a driving part disposed under the base substrate,
wherein:
the first base film has a first penetration part;
the second base film has a second penetration part overlapping the protrusion member and a second protrusion part protruding toward the first base film and overlapping the first penetration part; and
the connection wire extends to an upper surface of the base substrate along the protrusion member, and extends to a lower surface of the base substrate along the protrusion part, the connection wire being electrically connected to the pixel circuit and the driving part.

9. The display device of claim 8, wherein the first insulation layer has an opening overlapping the first penetration part.

10. The display device of claim 8, wherein the base substrate further comprises a second insulation layer disposed between the connection wire and the second base film.

11. The display device of claim 8, wherein the connection wire comprises:
a first surface defined as a portion of the connection wire exposed by the second penetration part on the upper surface of the base substrate; and
a second surface defined as a portion of the connection wire exposed by the first penetration part on the lower surface of the base substrate.

12. The display device of claim 11, wherein the first surface dose not overlap the second surface.

13. The display device of claim 12, wherein:
the driving part comprises a driving circuit and a conductive bonding member electrically connected to the driving circuit; and
the second surface of the connection wire directly contacts the conductive bonding member.

14. The display device of claim 12, wherein:
the pixel circuit comprises a pad electrode electrically connected to the transistor; and
the first surface of the connection wire directly contacts the pad electrode.

15. The display device of claim 8, wherein each of the first base film, the protrusion member, and the second base film has flexibility.

16. The display device of claim 15, wherein each of the first base film, the protrusion member, and the second base film comprises polyimide.

17. A method of manufacturing a display device comprising:
forming a preliminary first base film on a carrier substrate;
etching the preliminary first base film to from a first protrusion part protruding in a direction away from the carrier substrate and a first groove piercing in a direction toward the carrier substrate;
forming a connection wire on the preliminary first base film;
forming a second base film on the connection wire;
forming a pixel circuit on the second base film, the pixel circuit being electrically connected to the connection wire;
forming a light emitting element on the pixel circuit;
removing the carrier substrate;
forming a first base film by etching a lower surface of the preliminary first base film to expose the connection wire overlapping the first groove; and
forming a driving part under the first base film, the driving part being bonded to a lower surface of the first base film.

18. The method of claim 17, wherein forming a second base film comprises:
forming a preliminary second base film on the connection wire; and
etching an upper surface of the preliminary second base film to expose the connection wire overlapping the first protrusion part.

19. The method of claim 17, wherein:
the preliminary first base film comprises a lower film, an upper film disposed on the lower film, and a first insulation layer disposed between the lower film and the upper film;
the first protrusion part is formed by etching the upper film; and
the first groove is formed by etching the first insulation layer and the lower film.

20. The method of claim 19, wherein after forming a connection wire, a second insulation layer is formed on the connection wire.

* * * * *